United States Patent
Dhillon et al.

(10) Patent No.: US 11,746,436 B2
(45) Date of Patent: Sep. 5, 2023

(54) SINGLE CRYSTAL CHEMICAL VAPOR DEPOSITED SYNTHETIC DIAMOND MATERIALS HAVING UNIFORM COLOR

(71) Applicant: Element Six Technologies Limited, Oxfordshire (GB)

(72) Inventors: Harpreet Kaur Dhillon, Oxfordshire (GB); Ian Friel, Oxfordshire (GB); Daniel James Twitchen, Santa Clara, CA (US); Sarah Louise Geoghegan, Berkshire (GB); Helen Jennifer Gallon, Oxfordshire (GB); Neil Perkins, Oxfordshire (GB); Philip Maurice Martineau, Berkshire (GB)

(73) Assignee: Element Six Technologies Limited, Didcot (GB)

( * ) Notice: Subject to any disclaimer, the term of this patent is extended or adjusted under 35 U.S.C. 154(b) by 848 days.

(21) Appl. No.: 14/426,727

(22) PCT Filed: Sep. 13, 2013

(86) PCT No.: PCT/EP2013/069013
§ 371 (c)(1),
(2) Date: Mar. 6, 2015

(87) PCT Pub. No.: WO2014/044607
PCT Pub. Date: Mar. 27, 2014

(65) Prior Publication Data
US 2015/0240382 A1    Aug. 27, 2015

Related U.S. Application Data

(60) Provisional application No. 61/702,982, filed on Sep. 19, 2012.

(30) Foreign Application Priority Data

Sep. 19, 2012   (GB) ...................... 1216697

(51) Int. Cl.
| | | |
|---|---|---|
| C30B 29/04 | (2006.01) | |
| C30B 25/16 | (2006.01) | |
| C30B 25/02 | (2006.01) | |

(52) U.S. Cl.
CPC .............. *C30B 29/04* (2013.01); *C30B 25/02* (2013.01); *C30B 25/165* (2013.01);
(Continued)

(58) Field of Classification Search
CPC ..... C23C 16/278; C23C 16/006; C23C 16/27; C30B 33/02; C30B 29/04; Y10T 428/26; Y10T 428/24942; Y10T 428/2495
See application file for complete search history.

(56) References Cited

U.S. PATENT DOCUMENTS

2007/0036921 A1    2/2007  Twitchen et al.
2009/0297429 A1*  12/2009  Vohra ................... C30B 25/105
                                          423/446
(Continued)

FOREIGN PATENT DOCUMENTS

| | | |
|---|---|---|
| GB | 2477188 A | 7/2011 |
| WO | 2003014427 A1 | 2/2003 |

(Continued)

OTHER PUBLICATIONS

International Search Report for PCT/EP2013/069013 dated Dec. 20, 2013.
(Continued)

*Primary Examiner* — Laura A Auer
(74) *Attorney, Agent, or Firm* — Kilpatrick Townsend & Stockton LLP

(57) ABSTRACT

A coloured single crystal CVD synthetic diamond material comprising: a plurality of layers, wherein the plurality of layers includes at least two sets of layers which differ in terms of their defect composition and colour, wherein defect
(Continued)

type, defect concentration, and layer thickness for each of the at least two sets of layers is such that if the coloured single crystal CVD diamond material is fabricated into a round brilliant cut diamond comprising a table and a culet, and having a table to culet depth greater than 1 mm, the round brilliant cut diamond comprises a uniform colour as viewed by naked human eye under standard ambient viewing conditions in at least a direction through the table to the culet.

12 Claims, 6 Drawing Sheets

(52) U.S. Cl.
CPC .. *Y10T 428/2495* (2015.01); *Y10T 428/24942* (2015.01); *Y10T 428/26* (2015.01)

(56) References Cited

U.S. PATENT DOCUMENTS

| | | |
|---|---|---|
| 2010/0028556 A1 | 2/2010 | Linares et al. |
| 2012/0047950 A1 | 3/2012 | Grotjohn et al. |

FOREIGN PATENT DOCUMENTS

| | | |
|---|---|---|
| WO | 2003052174 A2 | 6/2003 |
| WO | 2003052177 A1 | 6/2003 |
| WO | 2004022821 A1 | 3/2004 |
| WO | 2005061400 A1 | 7/2005 |
| WO | 2010149775 A1 | 12/2010 |
| WO | 2010149777 A1 | 12/2010 |
| WO | 2010149779 A1 | 12/2010 |
| WO | 2012084656 A1 | 7/2012 |

OTHER PUBLICATIONS

UKIPO Search Report for GB1316322.5 dated Mar. 13, 2014.
UKIPO Search Report for GB1216697.1 dated Jan. 8, 2013.
Japanese Patent Application No. 2015-532377, Office Action dated Mar. 28, 2016, 2 pages.

* cited by examiner

SINGLE CRYSTAL CHEMICAL VAPOR DEPOSITED SYNTHETIC DIAMOND MATERIALS HAVING UNIFORM COLOR

FIELD OF INVENTION

Embodiments of the present invention relate to single crystal chemical vapour deposited (CVD) synthetic diamond materials having uniform colour and methods of making the same. In particular, certain embodiments of the present invention are concerned with the fabrication of uniformly coloured diamond materials at higher growth rates and/or the fabrication of novel coloured diamond materials.

BACKGROUND OF INVENTION

A range of coloured single crystal CVD synthetic diamond materials are known in the art including brown, blue, orange, green, red, pink and purple. Coloured single crystal CVD synthetic diamond material can be fabricated by introducing one or more dopants into the CVD synthesis process. For example, brown single crystal CVD synthetic diamond material can be fabricated by nitrogen doping as described in WO2003/052177. Blue single crystal CVD synthetic diamond material can be fabricated by boron doping as described in WO03/052174.

In addition to the above, the colour of single crystal CVD diamond material can be changed by annealing and/or irradiating the material after synthesis. A range of colours may be achieved depending on the exact type of starting material and nature of the irradiation and annealing treatments. For example, annealing single crystal CVD diamond material can change its colour as described in WO2004/022821. Colourless or near colourless single crystal CVD synthetic diamond material turns blue when irradiated as described in WO2010/149779. If irradiated and then heated to a temperature greater than approximately 700° C. then single crystal CVD synthetic diamond material which is originally colourless or near colourless can be converted to an orange colour as described in WO2010/149777 or a pink colour as described in WO2010/149775. Other colours may also be accessed depending on the exact type of starting material, the temperature and duration of any annealing steps, the energy and dose of any irradiation steps, and the number and order of any combination of irradiation and annealing steps.

For many optical applications colour uniformity is important and for jewellery applications it is of particular importance that the colour of the material appears uniform to the naked human eye under standard ambient viewing conditions, i.e. not making use of microscopy or spectroscopic techniques to detect variations in colour uniformity. In such applications, small variations in dopant concentration will not be visually detectable and thus will not detract from the perceptible quality of the material.

One way to provide uniform colour is to ensure that doping is carefully controlled at a constant level throughout the CVD growth process to prevent non-uniformities in colour in a growth direction of the material. In addition, it is also important to ensure that doping is controlled at a constant level in a direction perpendicular to the growth direction to prevent non-uniformities in colour across a lateral direction of the as-grown material. Gas flow, substrate temperature, and microwave plasma uniformity can affect the rate of dopant uptake and need to be carefully controlled.

In addition to controlling the level of dopant as described above, WO03/052174 discloses that dislocation defects extending through a single crystal CVD synthetic diamond material during growth can cause differential rates of dopant incorporation into the diamond lattice causing variations in dopant concentration in the resulting single crystal material. Such variations, if sufficiently large, can lead to non-uniform colour. WO03/052174 discloses that such non-uniformities can be reduced by performing CVD growth on a single crystal diamond substrate which has a very low dislocation defect concentration at a growth surface thereof and which has been carefully processed to avoid incorporating surface and sub-surface damage. Such a low surface defect substrate is taught to be advantageous in reducing the concentration of dislocations which can thread through into the single crystal CVD synthetic diamond material being grown thereon and cause differential uptake of dopant atoms.

In light of the above, it is known that careful substrate selection in combination with carefully controlled and uniform growth conditions can result in a single crystal CVD diamond material which is uniformly doped to the extent that its colour appears uniform to the naked human eye under standard ambient viewing conditions and indeed can be controlled to be at much higher levels of dopant uniformity for technical applications which require a high degree of uniformity. As such, it is technically feasible using prior art teachings to achieve uniformly coloured single crystal CVD synthetic diamond material.

However, in addition to technical feasibility, for a synthesis process to be commercially successful it must also be economically viable. For a single crystal CVD diamond synthesis process to be economically viable it must have a sufficiently high growth rate and a sufficiently high yield. Incorporating dopant into a single crystal CVD diamond growth process to change the colour of the material can affect both these parameters.

For example, it is known that incorporating a certain level of gaseous nitrogen into a single crystal CVD diamond growth process can increase the growth rate of the diamond material which is commercially advantageous. However, significant levels of nitrogen in the growth process tend to result in a single crystal CVD diamond product that is brown in colouration, which is not so desirable for jewellery applications. Furthermore, incorporating high levels of gaseous nitrogen into the growth process can lead to changes in crystal morphology of the single crystal CVD diamond material during growth and can lead to cracking thus reducing yield. This can be a particular problem when growing thick layers of single crystal CVD synthetic diamond material, e.g. more than 2 mm thick.

It is also known that while incorporating gaseous boron into a single crystal CVD diamond growth process can produce a blue coloured material, boron doping of single crystal CVD diamond significantly decreases the growth rate of the material, at least in comparison to a nitrogen assisted growth process, thus increasing production cost and reducing commercial viability.

In addition to the above, while it is known that a range of different coloured single crystal CVD synthetic diamond material can be achieved depending on the exact type of starting material and by applying various irradiation and/or annealing recipes, not all colours have been achieved to date and certain colours which have been achieved are not optimal for aesthetic appearance in jewellery applications. For example, certain colours achieved by specific growth and post growth irradiation and annealing recipes are too dark. In certain cases it is difficult to obtain the right ratio of defects to achieve a particular desired light fancy colour using a combination of growth and post-growth treatment recipes.

It is an aim of certain embodiments of the present invention to solve one or more of the aforementioned problems.

SUMMARY OF INVENTION

According to a first aspect of the present invention there is provided a coloured single crystal CVD synthetic diamond material comprising:
  a plurality of layers,
    wherein the plurality of layers includes at least two sets of layers which differ in terms of their defect composition and colour,
    wherein defect type, defect concentration, and layer thickness for each of the at least two sets of layers is such that if the coloured single crystal CVD diamond material is fabricated into a round brilliant cut diamond comprising a table and a culet, and having a table to culet depth greater than 1 mm, the round brilliant cut diamond comprises a uniform colour as viewed by naked human eye under standard ambient viewing conditions in at least a direction through the table to the culet.

According to a second aspect of the present invention there is provided a method of fabricating a coloured single crystal CVD synthetic diamond material as defined above, the method comprising:
  varying at least one dopant gas concentration in a single crystal CVD synthetic diamond growth process to form a coloured single crystal CVD synthetic diamond material comprising plurality of layers which differ in terms of their defect composition and colour,
    wherein the dopant gas concentration and time period of the variation in dopant gas concentration is controlled such that if the coloured single crystal CVD diamond material is fabricated into a round brilliant cut diamond comprising a table and a culet, and having a table to culet depth greater than 1 mm, the round brilliant cut diamond comprises a uniform colour as viewed by naked human eye under standard ambient viewing conditions in at least a direction through the table to the culet.

The variation in dopant gas concentration may be periodic such that each set of layers has a consistent thickness and/or defect concentration. Alternatively, the layer thicknesses and dopant/defect concentration may be varied for each set of layers.

In relation to the above, it should be noted that the requirement for the layers of material to have a different colour, for example when viewed under an optical microscope, does not require the different layers to have a different hue. For example, material according to the present invention may comprise layers of light blue material and layers of dark blue material.

It should also be noted that in certain contexts the term culet is understood by some to indicate a flat face on the bottom of a gemstone. In the context of the present invention it will be understood that the term culet may mean a flat face on the bottom of a gemstone or the lower point of a gemstone. That is, the aforementioned definition is not limited to the provision of a flat face on the bottom of a gemstone.

It should also be noted that the visually uniform coloured single crystal CVD synthetic diamond material of the present invention is not required to be cut into a round brilliant cut diamond in order conform to the aforementioned definitions. Rather, the reference to a round brilliant cut is made to define the colour uniformity of the single crystal CVD synthetic diamond material. As such, an uncut single crystal CVD synthetic diamond material or a single crystal CVD synthetic diamond material cut into another shape may still meet the aforementioned definitions if, when the material is cut, or re-cut, into a round brilliant cut diamond comprising a table and a culet, and having a table to culet depth greater than 1 mm, the round brilliant cut diamond comprises a uniform colour as viewed by naked human eye under standard ambient viewing conditions in at least a direction through the table to the culet. In this regard, it may also be noted that while the facet count of a round brilliant cut is standard, the actual proportions—crown height and crown angle, pavilion depth and pavilion angle, and table size—are not universally agreed upon and various slight variations exist. Benchmark round brilliant cuts include the American Standard, the Practical Fine Cut, the Scandinavian Standard, the Eulitz Brilliant, the Ideal Brilliant, the Parker Brilliant, and the Accredited Gem Appraisers (AGA) standard. Any one or more of these standard round brilliant cuts may be used to test the present invention.

Finally, it should also be noted that the definition of colour uniformity as viewed by the naked human eye should be construed in terms of a human subject who has clinically normal vision in terms of both resolution and colour perception (i.e. standard 20/20 vision with no colour blindness). Furthermore, standard ambient viewing conditions should be construed to mean in daylight if outdoors or in a well lit room if located indoors. Under such conditions, and if cut into a round brilliant cut diamond comprising a table and a culet, and having a table to culet depth greater than 1 mm, the material of the present invention should not have discernible bands or rings associated with the layered structure of the material when viewed in at least a direction through the table to the culet.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1A:
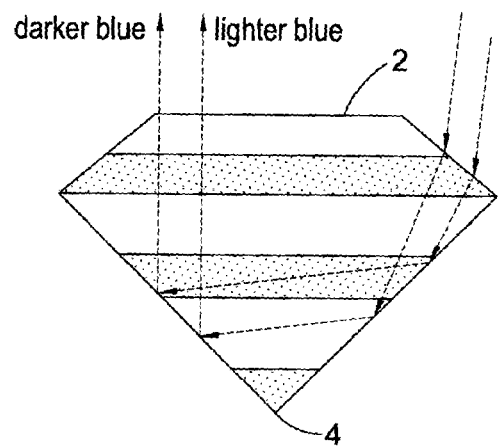
FIG. 1(a) shows a diagram illustrating internal reflection of light through a round brilliant cut single crystal CVD synthetic diamond and illustrating why alternating layers of differently doped material are visible as viewed in a direction through the table to the culet.

Embodiments of the present invention are based on the concept that an apparently uniform coloured single crystal CVD synthetic diamond can be fabricated from a single crystal CVD synthetic diamond material having layers (preferably parallel layers) with different dopant/defect compositions and colours if dopant/defect type, dopant/defect concentration, and layer thickness is controlled in the correct manner such that individual layers are not resolvable by the naked human eye under standard ambient viewing conditions when the material is cut into a gemstone.

It should be noted that fabricating single crystal CVD synthetic diamond material having layers with different dopant compositions is known in the art. However, these prior art arrangements only disclose dopant layers which are either: (i) completely invisible to the naked eye under standard ambient viewing conditions and which do not impart colour to the synthetic diamond material; or (ii) individually visible to the naked eye under standard ambient viewing conditions such that the synthetic diamond material does not appear uniformly coloured. There is no disclosure of how to form an apparently uniform coloured single crystal CVD synthetic diamond from a single crystal CVD synthetic diamond material having layers with different dopant compositions and colours by controlling dopant type, dopant concentration, and layer thickness in the correct manner such that individual layers are not resolvable by the naked human eye under standard ambient viewing conditions.

For example, dopant layers according to option (i) are proposed in WO2005/061400 as a means of marking a single crystal CVD synthetic diamond such that it can be distinguished from a natural diamond without affecting the perceived quality of the single crystal CVD synthetic diamond. In this case, dopant type and concentration are selected such that the doped layer is invisible to the naked eye and does not impart colour to the single crystal CVD synthetic diamond under standard ambient viewing conditions. However, the doped layer is visible under special viewing conditions such as under fluorescent imaging conditions. Having regard to option (ii), WO03/014427 discloses single crystal CVD synthetic diamond material fabricated with one or more layer having an increased concentration of one or more impurities (such as boron and/or isotopes of carbon), as compared to other layers or comparable layers without such impurities. It is suggested that such compositions provide an improved combination of properties including colour, strength, velocity of sound, electrical conductivity, and control of defects. However, such layers will be individually visible to the naked human eye (e.g. in the case of boron doping) or will not provide any colour at all (e.g. in the case of isotopic carbon doping).

More relevant to the present invention is US2010028556 which discloses that single crystal CVD synthetic diamonds may be provided with one or more layers of doping to form coloured synthetic diamonds. It is disclosed that layers of pink coloured synthetic diamond may be formed by doping with nitrogen and treated by irradiating and annealing. One embodiment suggests providing layers with high concentrations of nitrogen in a range 0.1 to 10 ppm to form pink coloured layers and layers with concentrations of nitrogen of less than approximately 50 ppb to form colourless layers. It is suggested that the nitrogen doped layers may have a thickness in the range of 1 μm to 1 mm. It is also disclosed that layers of blue coloured diamond material can be formed by doping with boron. One embodiment suggests providing blue layers of boron doped material with a boron concentration in a range 0.5 ppm to 1000 ppm and layers of undoped material. The layers of boron doped diamond are formed with a thickness of less than 1 μm to 50 μm US2010028556 also notes that in natural coloured diamonds, colour banding tends to be found on the [111] growth planes. Since diamond gemstones are usually cut with the table close to the [100] plane, it is stated that in natural coloured gems the colour bands can frequently be seen through the table of the stone producing an undesirable effect. In CVD grown stones, the growth occurs on or near the [100] planes. The colour banding is therefore parallel to the [100] plane. Since the table is cut closely parallel to the [100] plane, the view from the table looks perpendicular to the colour bands and US2010028556 suggests that because of this they cannot be seen, leading to a coloured gemstone having a highly desirable uniform coloured stone.

Figure 1B:
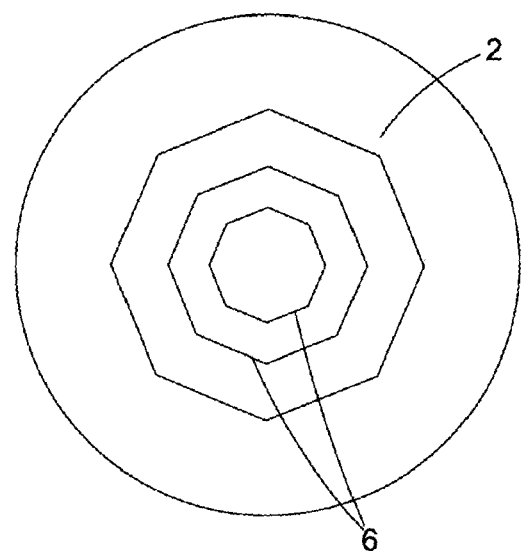
FIG. 1(b) shows a diagram illustrating a round brilliant cut single crystal CVD synthetic diamond viewed in a direction through the table to the culet with perceptible polygonal ring shaped striations associated with the layered structure of the material.

The above analysis provided in US2010028556 is technically incorrect. It is not the case that if the table is parallel to the colour bands then the colour bands cannot be seen viewing through the table leading to a coloured gemstone having a highly desirable uniform coloured stone. This is because light exiting the crown of a gemstone toward the viewer follows a path within the gemstone involving total internal reflection between opposing pavilion facets along a direction which can be substantially in the plane of one of the doped layers as illustrated in FIG. 1(a). As such, colour bands in the form of polygonal rings are visible through the table even when the colour bands are provided in a parallel direction relative to the table and thus perpendicular to the viewing direction through the table 2 to the culet 4. FIG. 1(b) shows a diagram illustrating a round brilliant cut single crystal CVD synthetic diamond viewed in a direction through the table 2 with perceptible polygonal ring shaped striations 6 associated with the layered structure of the material.

Figure 2A:
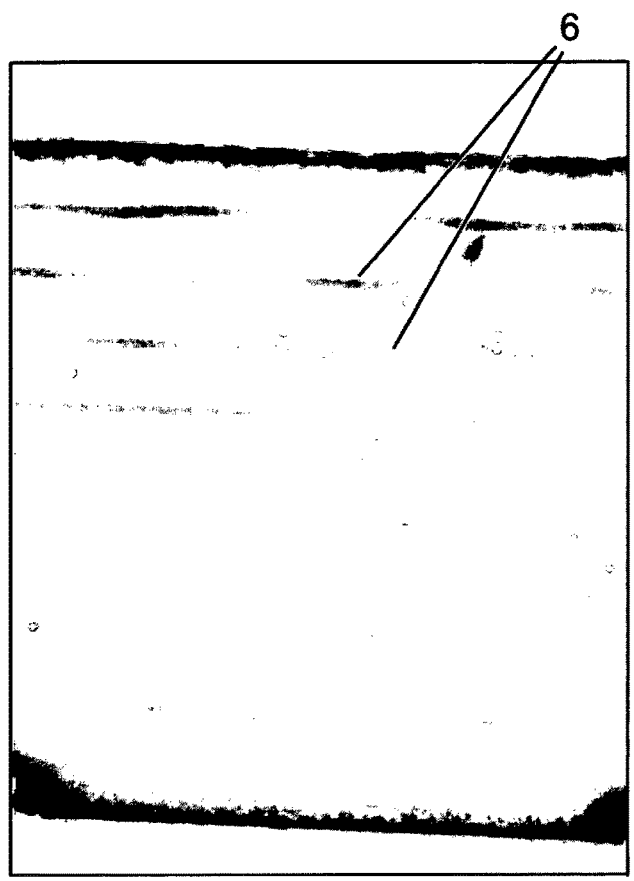
FIG. 2(a) shows a photograph of a cross-section of an as-grown single crystal CVD synthetic diamond material which comprises visible alternating layers of boron doped and nitrogen doped layers.
Figure 2B:
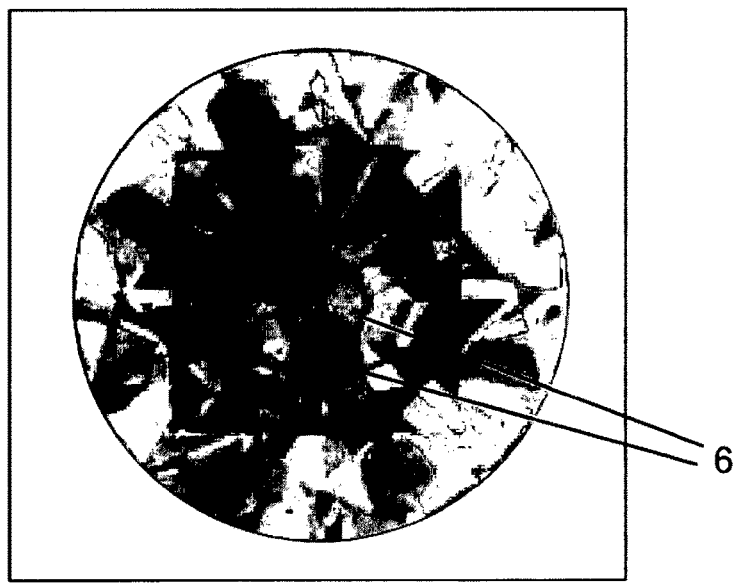
FIG. 2(b) shows a photograph of a round brilliant cut diamond fabricated from the as-grown single crystal CVD synthetic diamond material shown in FIG. 2(a) as viewed in a direction through the table to the culet showing visible polygonal ring shaped striations associated with the layered structure of the material.

While FIGS. 1(a) and 1(b) illustrates why US2010028556 is technically incorrect from a theoretical perspective, the present inventors have also experimentally tested the approach of US2010028556 and confirmed that following the teachings of US2010028556 does not result in a coloured gemstone having a highly desirable uniform coloured stone. In this regard, FIG. 2(a) shows a photograph of a cross-section of an as-grown single crystal CVD synthetic diamond material which comprises visible alternating layers 6 of boron doped and nitrogen doped layers. According to the teachings of US2010028556, if the material is fabricated into a round brilliant cut diamond with a table closely parallel to the <100> plane (i.e. in the plane of the layers), the round brilliant cut diamond should comprise a uniform colour as viewed through the table because the view through the table is perpendicular to the colour bands. However, this is not the case as illustrated in FIG. 2(b) which shows a photograph of a round brilliant cut diamond fabricated from the as-grown single crystal CVD synthetic diamond material shown in FIG. 2(a) as viewed in a direction through the table. As can be seen, in a cut gemstone viewed from above through its table, the layered structure appears as polygonal (e.g. octahedral) rings 6 of light and dark blue for the reasons illustrated in FIGS. 1(a) and 1(b). That is, light paths which are internally reflected primarily through the plane of a boron doped layer appear a darker blue, whereas light paths which are internally reflected primarily through the plane of a nitrogen doped layer appear a lighter blue or near-colourless. Because of the azimuthal symmetry of the gem this leads to light and dark rings as can be seen in the photograph shown in FIG. 2(b).

Figure 3A:
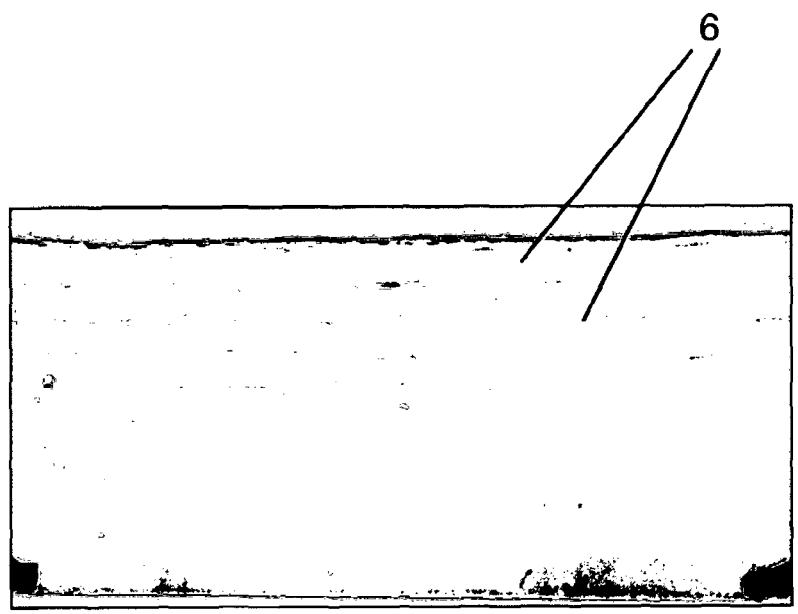
FIG. 3(a) shows a photograph of a cross-section of another as-grown single crystal CVD synthetic diamond material which comprises visible alternating layers of boron doped and nitrogen doped layers.
Figure 3B:
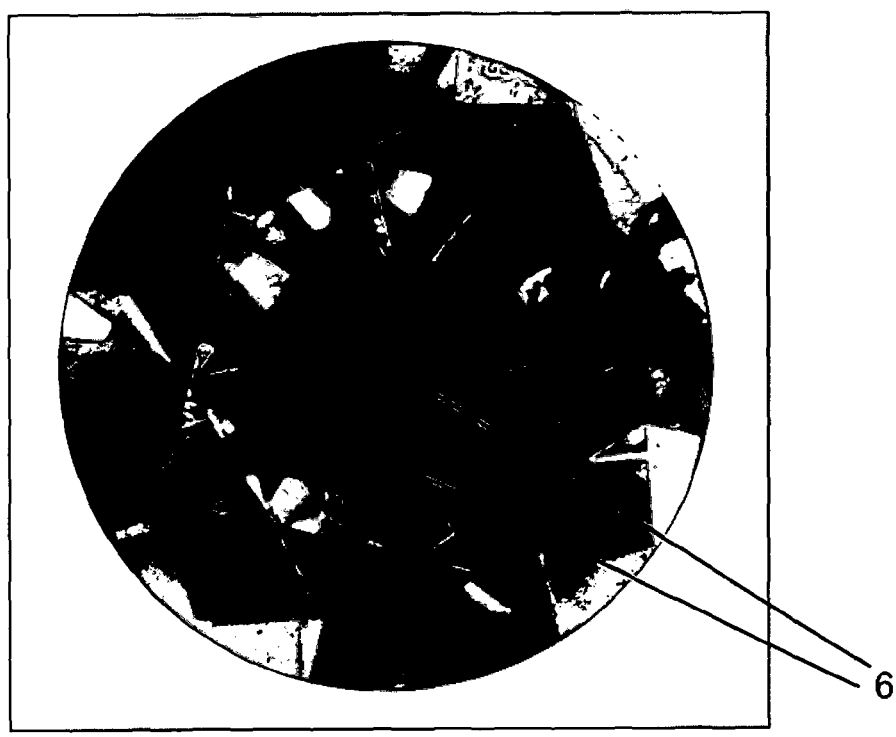
FIG. 3(b) shows a photograph of a round brilliant cut diamond fabricated from the as-grown single crystal CVD synthetic diamond material shown in FIG. 3(a) as viewed in a direction through the table to the culet showing visible polygonal ring shaped striations associated with the layered structure of the material.

FIG. 3(a) shows a photograph of a cross-section of another as-grown single crystal CVD synthetic diamond material which comprises visible alternating layers of boron doped and nitrogen doped layers. FIG. 3(b) shows a photograph of a round brilliant cut diamond fabricated from the as-grown single crystal CVD synthetic diamond material shown in FIG. 3(a) as viewed in a direction through the table to the culet. Although the diamond material is darker in colour compared with the example shown in FIGS. 3(a) and 3(b) the polygonal ring shaped striations associated with the layered structure of the material are still clearly visible.

In light of the above, it is clear that following the teachings of US2010028556 would not inevitably result in a coloured single crystal CVD synthetic diamond material which is uniform in colour. Rather, given the technical understanding set out above with reference to FIGS. 1 to 3 it would be understood by the skilled person that following the teachings of US2010028556 results in a coloured single crystal CVD synthetic diamond material which possess coloured polygonal rings associated with the layered structure of the material when viewed in a direction through the table to the culet. Furthermore, given the aforementioned understanding it would seem to be impossible to fabricate a single crystal CVD synthetic diamond material comprising coloured layers which did not possess coloured polygonal rings associated with the layered structure of the material when viewed in a direction through the table to the culet.

However, the present inventors have realized that this seeming impossibility only holds to the extent that the coloured polygonal rings can be resolved. Due to the fact that the naked human eye only has a limited resolving power then the present inventors have postulated that there may potentially be a parameter window in which coloured layers could provide significant colour to the single crystal CVD synthetic diamond as a whole without polygonal rings associated with the layered structure being resolvable, thereby generating a single crystal CVD synthetic diamond which is apparently uniform in colour to the naked eye even if polygonal rings associated with the layered structure are inevitably present and can be detected using optical equipment having a higher resolving power than the naked eye.

In light of the above, the present inventors have investigated what parameters may affect the visibility of coloured rings or bands associated with a layered single crystal CVD synthetic diamond, particularly if cut into a gemstone such as a round brilliant cut diamond. In doing so, the present inventors have managed to achieve a uniform coloured single crystal CVD synthetic diamond from a single crystal CVD synthetic diamond material having layers with different dopant compositions and colours through careful control of dopant type, dopant concentration, and layer thickness such that individual layers are not resolvable by the naked human eye under standard ambient viewing conditions. In achieving this goal, the present inventors have realised that visibility of doped coloured layers in a cut gemstone will depend on a number of parameters including:

(i) dopant concentration in the primary colour forming layers and the dopant distribution within those layers;

(ii) presence and concentration of other dopants in the primary colour forming layers which can compensate the primary colour forming dopant thus reducing colour (e.g. nitrogen present in a boron doped layer compensates for boron reducing blue colouration—specifically, by reducing uncompensated boron that leads to absorption in the red region and hence on transmission leads to a blue colouration);

(iii) dopant concentration in the other layers affecting the contrast between the primary colour forming layers and other layers disposed therebetween;

(iv) thickness of the primary colour forming layers;

(v) thickness of the other layers disposed between the primary colour forming layers; and (vi) gem size which will determine the path length of light through the layered structure.

FIG. 4 shows two graph illustrating the trend in visibility of individual layers with: (a) varying layer thickness and dopant concentration in colour forming layers for a round brilliant cut single crystal CVD synthetic diamond of a fixed size; and (b) varying layer thickness and size for a round brilliant cut single crystal CVD synthetic diamond having a fixed dopant concentration in a set of colour forming layers. It should be noted that the graphs indicated arbitrary units (AU) and are not meant to suggest a specific functional form but merely illustrate trends in the visibility of individual layers in a layered doped structure. The graphs indicate trends for blue boron doped layers separated by low nitrogen concentration doped layers assuming that the low nitrogen concentration doped layers will be relatively colourless. However, similar trends will apply for other dopant/defect types.

Figure 4A:
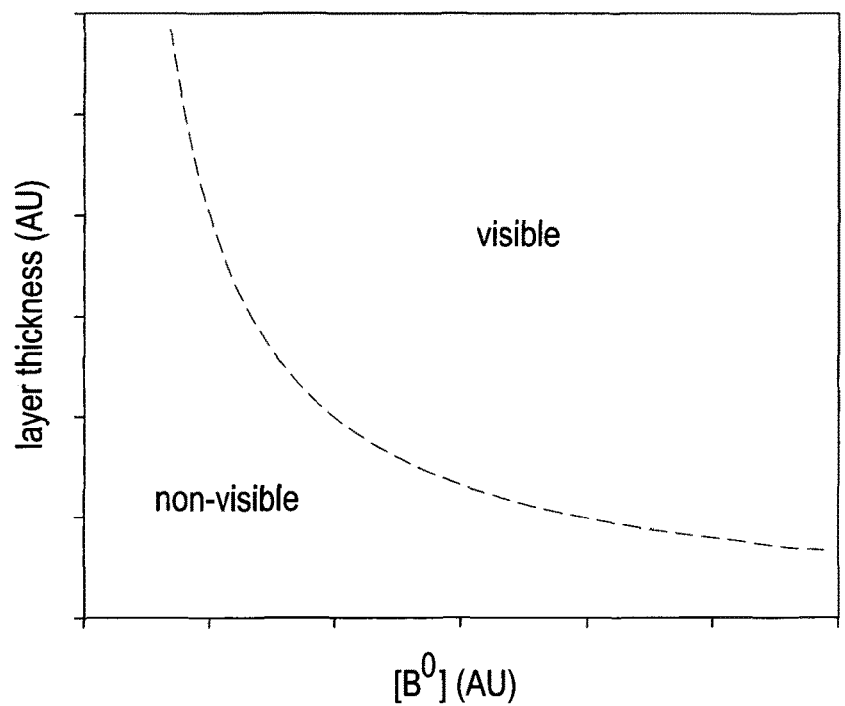
FIG. 4 shows two graph illustrating the trend in visibility of individual layers with: (a) varying layer thickness and boron dopant concentration in blue colour forming layers for a round brilliant cut single crystal CVD synthetic diamond of a fixed size; and (b) varying layer thickness and size for a round brilliant cut single crystal CVD synthetic diamond having a fixed boron dopant concentration in a set of colour forming layers.
Figure 4B:
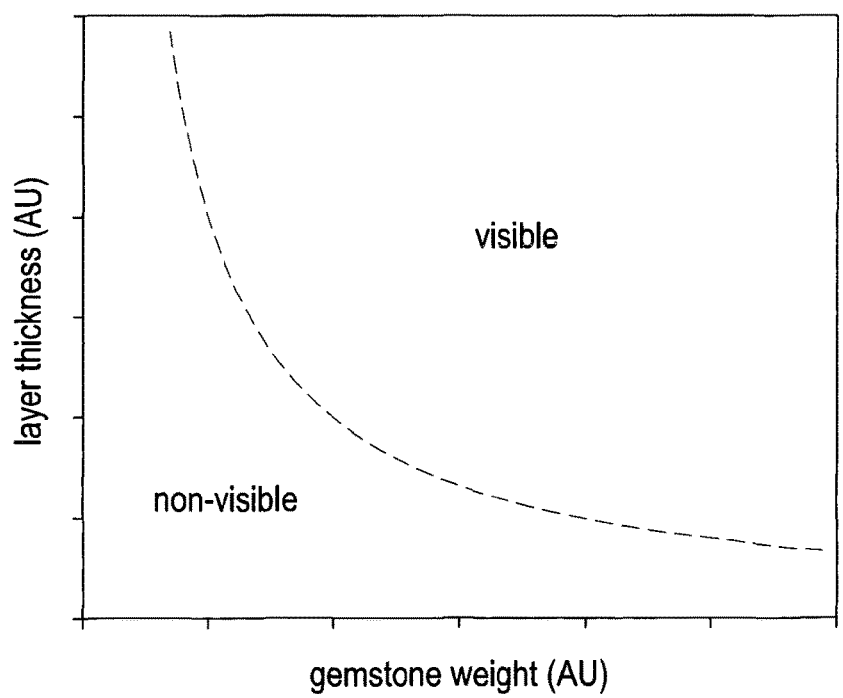

FIG. 4(a) illustrates that for a round brilliant cut single crystal CVD synthetic diamond of a fixed size, the individual visibility of blue boron doped layers increases with increasing boron concentration and with increasing layer thickness. FIG. 4(b) illustrates that for a round brilliant cut single crystal CVD synthetic diamond having a fixed boron concentration in the boron doped layers, the individual visibility of the blue boron doped layers increases with increasing layer thickness and increasing gemstone size.

As such, the visibility of individual layers in a layered doped structure will:
(i) increase with increasing dopant/defect concentration in the primary colour forming layers;
(ii) decrease with increasing concentration of compensating dopant in the primary colour forming layers;
(iii) decrease with increasing dopant concentration in the other layers which lowers the contrast between the primary colour forming layers and other layers disposed therebetween;
(iv) increase with increasing thickness of the primary colour forming layers;
(v) increase with increasing thickness of the other layers disposed between the primary colour forming layers; and
(vi) increase with gem size which will determine the path length of light through the layered structure with larger path lengths through the plane of the doped layers when light is internally reflected as illustrated in FIG. 1 making them more individually visible.

By selecting a suitable combination of values for each of the aforementioned parameters it has been found to be possible to achieve a uniform coloured single crystal CVD synthetic diamond as viewed by naked eye under standard viewing conditions when cut into a gemstone from a single crystal CVD synthetic diamond material having layers with different dopant compositions and colours. As an illustration of how this is done, an embodiment of the present invention will be described in more detail for achieving uniform blue coloured single crystal CVD diamond material using boron doped and nitrogen doped layers.

Doping single crystal synthetic diamond material with boron during CVD growth can lead to blue material suitable for making blue CVD synthetic gemstones. Light passing through the diamond material appears blue by subtractive colouration. The amount of blue colour (saturation) is determined by the following equation:

$$\int dr[B^0(r)]$$

where $[B^0(r)]$ is the concentration of uncompensated boron at position r and the integral is along the optical path within the diamond material. The greater this quantity, the darker blue the diamond will appear. The uncompensated boron concentration is the concentration of boron over and above that which is off-set by a co-dopant which quenches absorption resulting in a blue colouration. For example, co-dopants such as silicon or nitrogen can quench blue colouration resulting from boron dopant as described in WO2005/061400 and by balancing boron concentration and co-dopant concentration it is possible to fabricate colourless or near colourless single crystal CVD synthetic diamond material which would otherwise be coloured blue in the absence of the co-dopant. As such, in relation to colour intensity the uncompensated boron concentration, rather than the actually total boron concentration, is the important parameter.

Single crystal CVD synthetic diamond material containing uncompensated boron shows a characteristic one-phonon absorption feature with a maximum at 1282 $cm^{-1}$ (159 meV). It has been found that there is a linear relationship between the concentration of uncompensated boron and the contribution of this band to the absorption coefficient at 1282 $cm^{-1}$. The concentration of uncompensated boron in ppm is 1.2×Absorption Coefficient at 1282 $cm^{-1}$ when the measurement is carried out at room temperature.

Single crystal CVD synthetic diamond material containing uncompensated boron also shows a characteristic absorption at 2457 $cm^{-1}$ (304.5 meV) that can be revealed by subtraction of the intrinsic two-phonon absorption. When the feature at 1282 $cm^{-1}$ is too weak to be usable to calculate the uncompensated boron concentration, the uncompensated boron concentration can be derived from the integrated absorption coefficient of the band at 2457 $cm^{-1}$ using the relationship: uncompensated boron concentration (ppm) =0.00142×integrated absorption coefficient at 2457 $cm^{-1}$ (meV·$cm^{-1}$).

A representative map of the concentration of the uncompensated boron in a single crystal CVD synthetic diamond sample can be generated by collecting FTIR spectra at room temperature at a plurality of points across a cross-section of a sample and using one of the relationships above to derive the concentration of uncompensated boron for each position.

Uncompensated boron concentration can also be measured using ultraviolet cathodoluminescence spectroscopy. The ultraviolet cathodoluminescence spectra (recorded at 77 K) of high quality boron doped diamond shows strong boron bound exciton emission at 5.22 eV (237.5 nm) and free exciton emission at 5.27 eV (235.2 nm). For high quality diamond with boron concentrations up to approximately 1 ppm, there exists an approximate proportionality between the ratio of the integrated intensities of these two emissions measured at 77 K and the concentration of uncompensated boron. This is given by the relationship: uncompensated boron concentration (ppm)=1.86×I (B bound exciton intensity)/I (free exciton intensity). Across a wide range of boron concentrations measurement of this ratio at different positions across a sample can be used to judge the magnitude and uniformity of uncompenstated boron concentration. A sample is coated with a thin (5 nm), uniform layer of gold to prevent charging effects, mounted at 77 K in an scanning electron microscope, and UV cathodoluminescence spectra are captured with an accelerating voltage of 15 kV, a current of 0.2 microamps and a spot size of less than 10 μm×10 μm. A representative map of the concentration of the uncompensated boron through a single crystal CVD synthetic diamond sample can be generated by collecting spectra at a plurality of points across a cross-section of the sample.

Total boron concentration can be measured in a single crystal CVD synthetic diamond sample using secondary ion mass spectrometry (SIMS). Although the concentration of uncompensated boron concentration rather than total boron concentration is the more important parameter when assessing colour, for samples which do not comprise significant levels of compensating co-dopant in the boron doped layers then the total boron concentration as measured by SIMS will be approximately equal to the uncompensated boron concentration. As such, SIMS may also be used as a means to measure boron content in certain embodiments.

Total nitrogen concentration can also be measured in a single crystal CVD synthetic diamond sample using secondary ion mass spectrometry (SIMS). In contrast, single substitutional nitrogen concentration can be measured by electron paramagnetic resonance (EPR). Single substitutional nitrogen concentration can also be measured using the 1344 $cm^{-1}$ infrared absorption feature. These methods are known in the art.

In all the above measurement methods, sufficient spatial resolution is required to detect the layered structure. A more simple non-quantitative approach is also possible to detect a layered structure in an apparently uniform coloured sample by examining a cross-section of material under an optical microscope in transmission mode. This method is suitable for layers with sufficient optical contrast.

Boron doped CVD single crystal diamond grows at a relatively slow rate. This increases the cost of producing blue material for CVD synthetic gemstones. It also means longer CVD growth runs are required to grow reasonably thick material. This increases the probability of run failure and hence reduces the run-to-completion rate, thus increasing costs further. Doping single crystal diamond with nitrogen during CVD growth produces a near-colourless to brown/black material, depending on the amount of nitrogen added to the process and other synthesis conditions. CVD synthesis with added nitrogen generally leads to an enhancement in the growth rate.

Accordingly, the present inventors have aimed to grow single crystal CVD synthetic diamond with alternating layers of boron doped and nitrogen doped material, leading to an enhancement in the average growth rate whilst producing an overall blue colour in which the layers are not visible to the naked human eye under normal ambient viewing conditions when the material is cut and polished into a facetted gemstone.

For a layered single crystal CVD synthetic diamond material, boron doped layers should have an uncompensated boron concentration $[B^0]>0$ in order to produce a blue colouration. These layers could be co-doped with nitrogen as long as the boron content is higher than the single substitutional nitrogen content $N_s^0$ where $[B^0]>[N_s^0]>0$ such that some blue colour remains in the boron doped layers. A range of different layer thicknesses, dopant concentrations, and gemstone sizes have been fabricated to investigate the parameter space as previously discussed and identify suitable combinations of parameters which result in a visibly uniform blue colouration. The table below indicates three examples:

within a diamond material is a complex function of a range of interrelated parameters as described herein. As such, the most clear way of defining the invention without unduly restricting its scope is in terms of the colour uniformity of the product material as viewed by naked human eye under standard ambient viewing conditions. This feature of the product is readily testable and following the teachings provided within this specification is readily achievable without undue burden.

Example 1 is a single crystal CVD synthetic diamond structure fabricated with boron doped layers of thickness 60 µm and nitrogen doped layers of thickness 315 µm. A solid boron dopant concentration of approximately 2 ppm was provided in the boron doped layers. When polished into 0.53 and 0.6 ct round brilliant cut diamonds, the round brilliant cut diamonds exhibited no visible layering when viewed by eye without the aid of instrumentation.

Example 2 is a single crystal CVD synthetic diamond structure fabricated with boron doped layers of thickness 20 µm and nitrogen doped layers of thickness 155 µm, i.e. thinner layers than for Example 1. A solid boron dopant concentration of approximately 2 ppm was provided in the boron doped layers. When polished into round brilliant cut diamonds of size between 0.96 and 2.14 ct, the round brilliant cut diamonds exhibited no visible layering when viewed by eye without the aid of instrumentation.

Example 3 is a single crystal CVD synthetic diamond structure fabricated with boron doped layers of thickness 54 µm and nitrogen doped layers of thickness 375 µm, i.e. similar layer thicknesses to Example 1. A solid boron dopant concentration of approximately 2 ppm was provided in the boron doped layers. When polished into a round brilliant cut diamond of size between 1.16 ct (i.e. larger than Example 1), the round brilliant cut diamond exhibited visible layering when viewed by eye without the aid of instrumentation.

| | Layer Thickness (mm) | | $[B]_{solid}$ | Largest RBC | FM (B layer thickness × N layer | |
|---|---|---|---|---|---|---|
| | B layer | N layer | (ppm) | depth (mm) | thickness × $[B]_{solid}$ × RBC depth) | Visibility of layers |
| Example 1 | 0.06 | 0.315 | ~2 ppm | 3.3 | 0.125 | Not Visible |
| Example 2 | 0.02 | 0.155 | ~2 ppm | 5.0 | 0.031 | Not Visible |
| Example 3 | 0.054 | 0.375 | ~2 ppm | 4.1 | 0.166 | Visible |

Given that colour uniformity of a layered structure will be dependent on layer thicknesses, dopant concentrations, and size/depth of sample as previously described, then a rough figure of merit (FM) for visibility of individual layers can be calculated for a structure comprises at least two sets of layers as the product: FM=layer thickness (mm) for a first set of layers×layer thickness (mm) for the second set of layers×colour forming dopant concentration (ppm)×round cut brilliant depth (mm). The larger the FM value the more likely it is that the layered structure will be visible to the naked human eye in a cut gemstone. Values for three example material are given in the above table indicating that a FM value above 0.15 resulted in visible colour bands in a cut gemstone whereas values below 0.15 resulted in no visible colour bands in a cut gemstone. As such, the figure of merit is preferably no more than 0.15, 0.13, 0.11, 0.09, 0.07, or 0.05. However, it should be noted that this is a rough guide based on the assumption that each parameter is given an equal weight in contributing to the visibility of the layers in a cut gemstone. It will be appreciated that the visibility of coloured bands or rings associated with coloured layers In light of the above, it is clear that when fabricating a layered round brilliant cut diamond of larger size (e.g. greater than 1 ct) then lower dopant concentrations and/or thinner layers can aid in ensuring that the layered structure is not visible to the naked human eye.

The largest single crystal CVD synthetic round brilliant cut gemstones of interest are likely to be of the order of 10 ct in size which equates to a table to culet depth of around 8.4 mm. A "standard" size is of the order 0.5 ct which for a round brilliant cut gemstone has a depth of around 3.1 mm. In contrast, a "melee" size might start at a size of around 0.02 ct which for a round brilliant cut gemstone has a depth of around 1.1 mm. Accordingly, in certain embodiments of the present invention the round brilliant cut diamond may have a size no less than 0.01 ct, 0.02 ct, 0.05 ct, 0.10 ct, 0.5 ct, 0.75 ct, 1.0 ct, 2.0 ct, or 5 ct. Furthermore, in certain embodiments of the present invention the round brilliant cut diamond may have a size no more than 10 ct, 8 ct, 5 ct, 3 ct, 2 ct, or 1 ct. In certain embodiments of the present invention the round brilliant cut diamond may comprise at least 5, 10, 20, 30, 40 or 50 layers.

When viewed from above the optical path length of light passing through a round brilliant cut gemstone is approximately 2×depth. Visible blue colour is defined as an optical path length×[B⁰] product of >0.2 ppm·mm where [B⁰] is the uncompensated boron concentration. An acceptable intense dark blue colour is defined as an optical path length×[B⁰] product of <10 ppm·mm above which the colour of the material is overly dark.

Given the above, a very pale blue layered round brilliant cut single crystal CVD synthetic diamond of size 10 ct will require boron doped layers with $[B^0]>0.2/(2\times 8.4)=0.012$ ppm or $2.1\times 10^{15}$ cm$^{-3}$. A layered round brilliant cut single crystal CVD synthetic diamond of size 0.5 ct will require boron doped layers with $[B^0]>0.2/(2\times 3.1)=0.032$ ppm or $5.7\times 10^{15}$ cm$^{-3}$. A layered round brilliant cut single crystal CVD synthetic diamond of size 0.02 ct will require boron doped layers with $[B^0]>0.2/(2\times 1.1)=0.091$ ppm or $1.6\times 10^{16}$ cm$^{-3}$.

In contrast, an intense dark blue layered round brilliant cut single crystal CVD synthetic diamond of size 10 ct will require boron doped layers with $[B^0]<10/(2\times 8.4)=0.595$ ppm or $1.1\times 10^{17}$ cm$^{-3}$. A layered round brilliant cut single crystal CVD synthetic diamond of size 0.5 ct will require boron doped layers with $[B^0]<10/(2\times 3.1)=1.61$ ppm or $2.8\times 10^{17}$ cm$^{-3}$. A layered round brilliant cut single crystal CVD synthetic diamond of size 0.02 ct will require boron doped layers with $[B^0]<10/(2\times 1.1)=4.54$ ppm or $8.0\times 10^{17}$ cm$^{-3}$.

The dopant concentration and layer thicknesses should be controlled such that if the coloured single crystal CVD diamond material is fabricated into a round brilliant cut diamond comprising a table and a culet, and having a table to culet depth greater than 1 mm, the round brilliant cut diamond comprises a uniform colour as viewed by naked human eye under standard ambient viewing conditions in at least a direction through the table to the culet. Preferably, the dopant concentration and layer thicknesses are controlled such that the round brilliant cut diamond also has uniform colour as viewed by naked human eye under standard ambient viewing conditions in a direction from the culet to the table and most preferably also when viewed from a side in a direction perpendicular to the table to culet direction. Typically, to achieve this goal the boron doped layers may have an uncompensated boron dopant concentration no less than 0.01 ppm, 0.03 ppm, 0.09 ppm, 0.15 ppm, 0.20 ppm, 0.50 ppm, 1.00 ppm, 1.50 ppm, 2.00 ppm, 3 ppm, or 4 ppm depending on layer thickness and sample size. Furthermore, the boron doped layers may have an uncompensated boron dopant concentration no more than 5.00 ppm, 4.00 ppm, 3.00 ppm, 2.00 ppm, 1.00 ppm, 0.50 ppm, or 0.10 ppm depending on layer thickness and sample size.

In addition, the layered single crystal CVD synthetic diamond material may have nitrogen doped layers between the boron doped layers in which $[N_s^0]>0$ in order to increase the average growth rate. For the nitrogen doped layers, a higher nitrogen level results in a faster growth rate and hence a more economical process. However, at too high a level, the nitrogen doped layers will take on a brown appearance which will impact the overall hue (colour) of the layered structure. The level of nitrogen (hence brown colouration) which starts producing an unattractive effect will depend to some extent on the saturation of the blue boron doped layers. For a layered structure containing pale blue boron doped layers the tolerable levels of nitrogen in the nitrogen doped layers is relatively low. A single substitutional nitrogen concentration $N_s^0$ of between 0 and 5 ppm can be used. At the higher end of this range, the nitrogen doped layer may be grown in the presence of oxygen to reduce the brown colouration induced by the presence of nitrogen. Furthermore, for higher levels of nitrogen the material can be treated post-growth to remove the brown components and hence improve hue of the product material. Typically, the nitrogen doped layers may have a single substitutional nitrogen concentration of no more than 10 ppm, 7 ppm, 5 ppm, 3 ppm, 2.5 ppm, 2.0 ppm, 1.5 ppm, or 1 ppm depending on layer thickness, size of sample, and concentration of boron in the boron doped layers with lighter blue samples less tolerable to brown colouration in the nitrogen doped layers. Furthermore, the nitrogen doped layers may have a single substitutional nitrogen concentration of no less than 0.01 ppm, 0.05 ppm, 0.10 ppm, 0.5 ppm, or 0.8 ppm. Higher nitrogen concentrations are desirable for increased growth rate but if the nitrogen concentration is too high then the nitrogen doped layers will become too brown and detrimentally affect the overall blue colour of the material.

The nitrogen doped layers may also include some boron dopant. However, boron will slow the growth rate of these layers. Accordingly, the nitrogen doped layers should include a higher concentration of nitrogen than boron. For example, the nitrogen doped layers may include boron at a concentration no more than 1.0 ppm, 0.75 ppm, 0.5 ppm, 0.25 ppm, 0.15 ppm, 0.09 ppm, 0.03 ppm, 0.01 ppm, or 0.005 ppm. In this regard, it may also be noted that near an interface between a nitrogen doped layer and a boron doped layer the nitrogen doped layer will include more boron. However, this boron level should advantageously drop off quickly to below the aforementioned levels.

Having regard to layer thicknesses, preferably the nitrogen doped layers are thicker than the boron doped layers. The nitrogen doped layers grow at a faster growth rate and thus to improve the economic viability of the process it is advantageous that the faster growing layers form the majority of the thickness of the product material. Preferably, the nitrogen doped layers have a layer thickness no less than 0.1 mm, 0.15 mm, 0.20 mm, 0.25 mm, or 0.30 mm. However, this must be balanced against the requirements that the layered structure should not be visible to the naked human eye which is the case if the nitrogen doped layers are made too thick relative to the boron doped layers. Accordingly, preferably the nitrogen doped layers have a layer thickness no more than 0.400 mm, 0.375 mm, 0.350, 0.325 mm, 0.300 mm, 0.250 mm, 0.200 mm, or 0.175 mm.

Preferably, the boron doped layers have a layer thickness no more than 0.1 mm, 0.08 mm, or 0.06 mm. While thinner layers are preferable from a growth perspective, the boron doped layers must be sufficiently thick to produce the desired blue colouration. As such, the boron doped layers preferably have a layer thickness no less than 0.001 mm, 0.01 mm, 0.015 mm, or 0.02 mm.

Figure 5A:
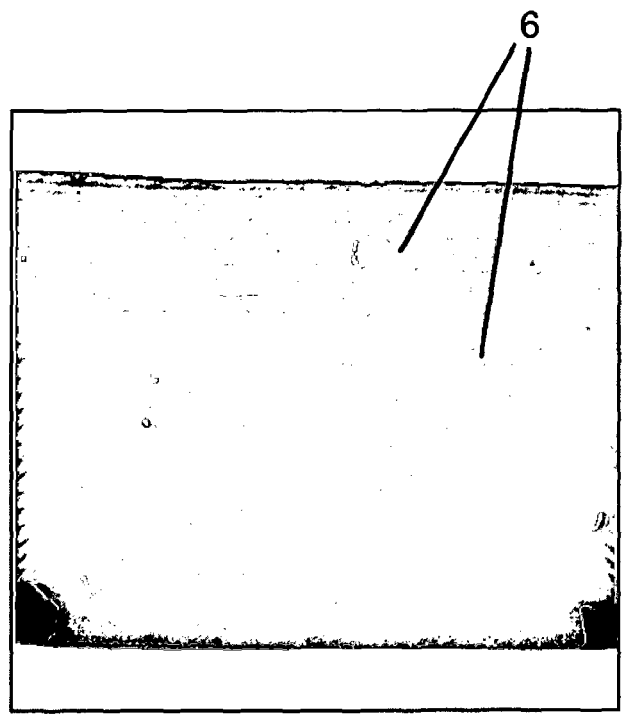
FIG. 5(a) shows a photograph of a cross-section of an as-grown single crystal CVD synthetic diamond material according to the present invention comprising visible alternating layers of boron doped and nitrogen doped layers.
Figure 5B:
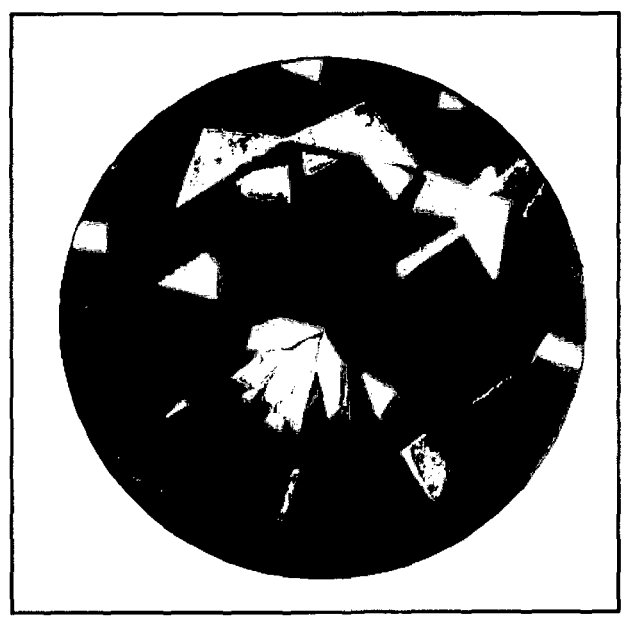
FIG. 5(b) shows a photograph of a round brilliant cut diamond fabricated from the as-grown single crystal CVD synthetic diamond material shown in FIG. 5(a) as viewed in a direction through the table to the culet showing no visible polygonal ring shaped striations associated with the layered structure of the material.

FIG. 5(a) shows a photograph of a cross-section of an as-grown single crystal CVD synthetic diamond material according to the present invention comprising alternating layers 6 of boron doped and nitrogen doped layers. While the layered structure is visible in the photograph of the as-grown material, the layers are not visible to the naked eye in a gemstone cut from such a material. FIG. 5(b) shows a photograph of a round brilliant cut diamond fabricated from the as-grown single crystal CVD synthetic diamond material shown in FIG. 5(a) as viewed in a direction through the table to the culet showing no visible polygonal ring shaped striations associated with the layered structure of the material.

Figure 6A:
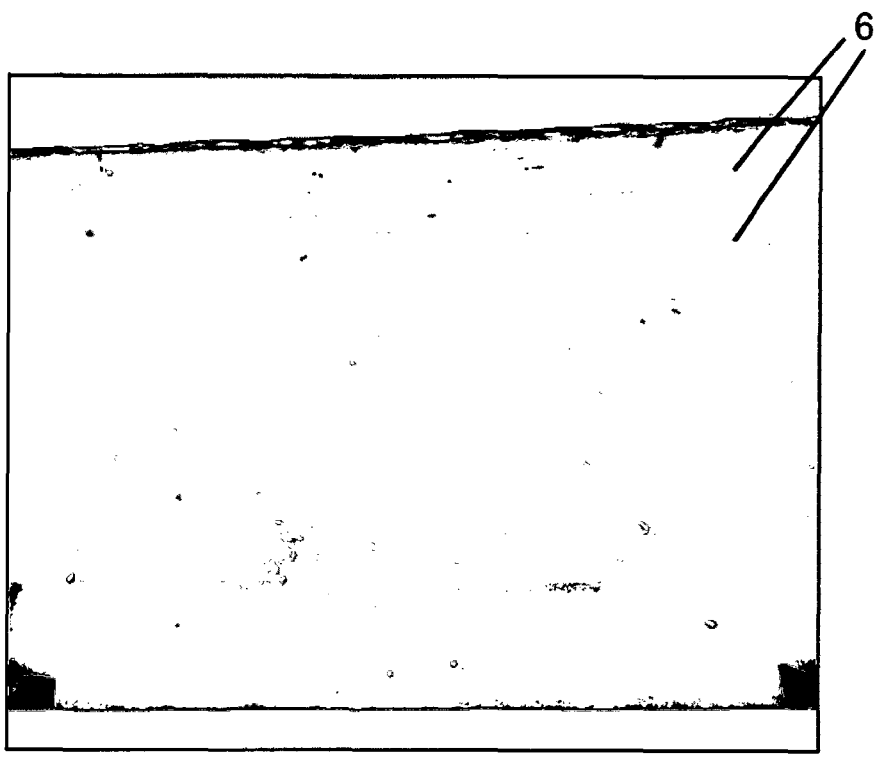
FIG. 6(a) shows a photograph of a cross-section of another as-grown single crystal CVD synthetic diamond material according to the present invention comprising visible alternating layers of boron doped and nitrogen doped layers.
Figure 6B:
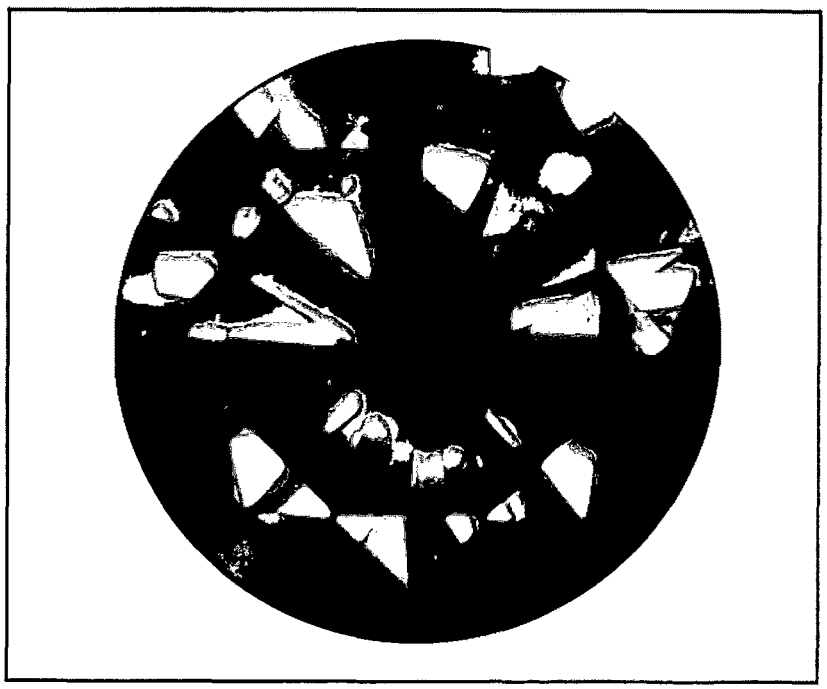
FIG. 6(b) shows a photograph of a round brilliant cut diamond fabricated from the as-grown single crystal CVD synthetic diamond material shown in FIG. 6(a) as viewed in a direction through the table to the culet showing no visible polygonal ring shaped striations associated with the layered structure of the material.

FIG. 6(a) shows a photograph of a cross-section of another as-grown single crystal CVD synthetic diamond material according to the present invention comprising visible alternating layers 6 of boron doped and nitrogen doped layers. Again, while the layered structure is visible in the photograph of the as-grown material, the layers are not visible to the naked eye in a gemstone cut from such a material. FIG. 6(b) shows a photograph of a round brilliant cut diamond fabricated from the as-grown single crystal CVD synthetic diamond material shown in FIG. 6(a) as viewed in a direction through the table to the culet showing no visible polygonal ring shaped striations associated with the layered structure of the material.

The illustrated embodiments in FIGS. 5 and 6 comprise boron doped and nitrogen doped layers as described above and exhibit a visually uniform blue colouration when cut into a gemstone. Furthermore, the layered single crystal CVD synthetic diamond material was grown at a much higher growth rate than that achievable for an equivalent blue material formed from a single layer of uniformly boron doped single crystal CVD synthetic diamond material.

While the preceding description has been largely focused on embodiments which comprising alternating layers of boron doped and nitrogen doped single crystal CVD synthetic diamond material, the same principles can be applied to other layered systems of single crystal CVD synthetic diamond material. For example, a layered system comprising layers with higher nitrogen concentration and layers with lower nitrogen concentration can be provided. In this case, layers with higher nitrogen concentration are advantageous to increase growth rate but can be detrimental in producing a brown colouration. This brown colouration can effectively be diluted by also providing colourless layers having a lower nitrogen content. Furthermore, by irradiating and annealing the material the higher nitrogen doped layers can be converted to a pink colouration such that the layered structure comprises pink and colourless layers. Following the principles as previously described, if the dopant concentrations, layer thicknesses, and sample sizes are controlled correctly then a uniform looking pink coloured material can be fabricated.

Coloured single crystal CVD synthetic diamond material according to the present invention can be fabricated by varying a dopant gas concentration in a single crystal CVD synthetic diamond growth process, optionally including a post-growth irradiation and/or annealing process, to form a coloured single crystal CVD synthetic diamond material comprising plurality of layers which differ in terms of their dopant/defect composition and colour. The dopant gas concentration and time period of the variation in dopant gas concentration is controlled such that if the coloured single crystal CVD diamond material is fabricated into a round brilliant cut diamond comprising a table and a culet, and having a table to culet depth greater than 1 mm, the round brilliant cut diamond comprises a uniform colour as viewed by naked human eye under standard ambient viewing conditions in at least a direction through the table to the culet.

One problem with growing a layered structure as described above is that it can be difficult to provide a precisely defined transition between one layer and the next. For example, if a layer of boron doped material is grown and then the boron gas source is shut off to grow an overlying layer of undoped or nitrogen doped material, the boron dopant concentration in the CVD reactor may only decreases very slowly resulting in a significant quantity of boron in the overlying layer. This can detrimentally slow the growth of the overlying layer. Similarly, on switching from a nitrogen doped layer to a boron doped layer a significant quantity of nitrogen remaining in the CVD reactor after the transition to the boron doped layer can result in the incorporation of nitrogen into the boron doped layer thus compensating the boron and detrimentally affecting the formation of a blue colouration. The present inventors have found that the use of a high gas flow rate CVD process as described in WO2012/084656 can be advantageous in achieving uniformly doped layers with better defined dopant concentrations and more precisely defined interfaces between different layers. For example, a layered single crystal CVD synthetic diamond material may be formed having a dopant concentration, for example boron, which varies by at least a factor of 3, 10, 30, 100, 300, 1000, 30000, or 100000 over a thickness of no more than 10 µm, 3 µm, 1 µm, 0.3 µm, 0.1 µm, 0.03 µm, 0.01 µm, 0.003 µm, or 0.001 µm at the transition region between layers. Embodiments thus allow the concentration of dopant to be changed quickly through a narrow transition region of as grown CVD synthetic diamond material while maintaining dopant uniformity across a specific layer within the CVD synthetic diamond material. That is, the dopant level in the CVD diamond material may be ramped up very quickly from undoped material to form a doped layer or ramped down quickly to move from a doped layer to an undoped layer over a short distance within the CVD synthetic diamond material. The latter has been found to be particularly problematic using prior art methods. However, it is possible to form doped layers within a CVD synthetic diamond material with well defined boundaries using high gas flow rates directed towards a growth surface of the CVD synthetic diamond material. Furthermore, such well defined layers can be formed in a single growth run. Previous attempts to form very well defined layers have involved growing a doped layer in one growth run and then transferring the material into another reactor to grow undoped material thereon as is was found to be difficult to sharply cut off the dopant being taken up by the CVD synthetic diamond material during a single growth run. However, this technique inevitably results in impurities, typically nitrogen or silicon, being incorporated at the interface between the doped layer and the overlying layer. This problem can be solved by using the methods described in WO2012/084656 to form a sharply defined doped layer in a single growth run. That is, using high velocity gas flows and/or a suitable Reynolds number can allow the formation of a synthetic single crystal CVD diamond comprising a doped layer and an adjacent undoped layer, wherein an interface between the doped and undoped layer is substantially free of impurities. An interface substantially free of impurities may be defined as an interface where, in a region either side of the interface extending to 20%, 50%, or 100% of a thickness of a doped layer, the impurity concentration does not exceed $10^{14}$, $3\times10^{14}$, $10^{15}$, $3\times10^{15}$, $10^{16}$, $3\times10^{16}$, or $10^{17}$, and does not vary in concentration by more than a factor of 2, 3, 5, 10, 30, 100, 300, or 1000. Multiple profile measurements may be taken across an interface to show that this criteria is met across substantially all the interface, e.g. a measurement may be made 1, 2, 3, 5, or 10 times at 1 mm spacings along a line across the interface with all measurements meeting the required criteria.

In addition, or as an alternative to the well defined interfaces as described above, gas phase dopant levels can be controlled to compensate for a time lag between a dopant gas being shut off and the time the dopant stops being incorporated into the growing diamond material. For example, in the previously described boron doped and nitrogen doped layer system the time lag between boron dopant gas being shut off after the boron layer growth phase and the time at which boron dopant ceases to be incorporated into the overlying nitrogen doped layer can be significant, e.g. 20 minutes or more. As such, the nitrogen doped layer comprises a significant concentration of boron in at least a first portion of the layer after the boron dopant gas has been shut off and the nitrogen dopant gas turned on. That is, the boron concentration in the growing diamond material slowly tails off into the nitrogen doped layer. Realizing this, it is possible to deliberately use a higher nitrogen gas phase dopant concentration at the start of the nitrogen doped layer growth phase to compensate for the slow boron dopant tail-off and then gradually reduce the nitrogen concentration as the boron concentration reduces. In this way, it is possible to maintain a substantially uniformly fast growth rate in the nitrogen doped layer while at the same time keep the colour of the layer substantially constant.

Optionally, the coloured single crystal CVD synthetic diamond material can be irradiated and/or annealed to alter the colour of the as-grown material. Various irradiation and annealing recipes are known to produce coloured single crystal CVD synthetic diamond materials as described in the background section. Furthermore, US2010028556 mentions irradiation and annealing in the context of fabricating layered pink coloured single crystal CVD synthetic diamond materials. In the context of the present invention the key factor is controlling defect/dopant concentrations in the layered structure such that after irradiation and/or annealing the material has a visually uniform colour to the naked human eye when fabricated into a round brilliant cut diamond. In this regard, it may be noted that the colour change of a single crystal CVD synthetic diamond material will depend on the nature of the defect/dopant concentration and the natural of the irradiation/annealing process. While it is possible to apply individual treatments to different layers this is technically difficult and time consuming thus increasing production cost. Given that in a layered structure at least two different types of single crystal CVD synthetic diamond material will be present, and given that it will be difficult to apply an irradiation and/or annealing technique to individual layers, then the defect structure of both types of layer must be carefully controlled such that a common irradiation and/or annealing treatment will effect a desired colour change in at least one of the sets of layers without causing a detrimental colour change in the other layers.

For example, colourless or near colourless single crystal CVD synthetic diamond material turns blue or blue-green when irradiated as described in WO2010/149779. It is described that the material has a product of total isolated vacancy concentration×path length of at least 0.072 ppm cm and at most 0.36 ppm cm. The isolated vacancy concentration is provided by controlling gas phase nitrogen concentration during CVD growth whereas the isolated vacancy concentration is generated by irradiating the as-grown material, for example using electrons, which forms isolated vacancy defects. Increasing nitrogen and vacancy concentrations can result in a darker blue-green colouration which may not be so desirable. However, as nitrogen can increase the growth rate of the material then it may be desirable from an economic perspective to use a higher level of nitrogen dopant. In this case, it may be possible to still fabricate a desirable pale blue by forming a layered structure with increased nitrogen concentrations in one set of layers producing a darker colouration after irradiation and a reduced nitrogen concentration in another set of layers to produce a lighter colouration or to produce near-colourless or colourless material after irradiation. Alternatively, if a paler colour is desired then one way to achieve this would be to form a layered structure in which one set of layers has sufficient nitrogen to meet the criteria as set out in WO2010/149779 after irradiation whereas the other layer has much lower nitrogen concentrations such that the material remains colourless or near colourless after irradiation.

WO2010/149777 describes an irradiation and annealing recipe for fabricating an orange coloured single crystal CVD synthetic diamond material while WO2010/149775 describes an irradiation and annealing recipe for fabricating pink coloured single crystal CVD synthetic diamond material. These recipes may be transferred into a layered structure such that the layering adds an additional degree of freedom to controlling the colour quality of the material. For example, recipes which produce dark colouration can be used in conjunction with colourless layers to produce an overall paler coloured material. Furthermore, rather than providing a layered structure comprising colour-forming layers and colourless or near colourless layers, it is possible to provide multiple colour-forming layers. In this case, by controlling dopant concentration, layer thicknesses, and sample size it is possible to provide colour mixing to achieve a new colour without individual layer colours resolvable to the naked human eye.

Thus far, layered structures according to the present invention have been described in terms of increasing growth rates and accessing different colours and colour saturations. Certain embodiments of the present invention can also aid in an increased yield. For example, dopant recipes for producing certain colours have been found to lead to changes in crystal morphology of the single crystal CVD diamond material during growth. This can lead to cracking thus reducing yield, particularly when growing thick layers of material e.g. more than 2 mm thick. Layering such a material as described herein can reduce such changes in crystal morphology and thus increase yield while still obtaining a visually uniform coloured material. As such, embodiments of the present invention may have one or more of the following advantageous characteristics:

(1) producing uniformly coloured single crystal CVD synthetic diamond material at increased growth rates compared with non-layered equivalents;
(2) producing uniformly coloured single crystal CVD synthetic diamond material with a lighter colour compared with non-layered equivalents;
(3) producing uniformly coloured single crystal CVD synthetic diamond material with new colours not previously accessible in non-layered single crystal CVD synthetic diamond material; and
(4) producing uniformly coloured single crystal CVD synthetic diamond material with increased yield compared with non-layered equivalents in which dopants lead to changes in crystal morphology during growth causing stress and cracking.

In addition to controlling dopant concentrations and layer thicknesses as described above in order to control colour uniformity, another source of colour variation in single crystal CVD synthetic diamond material arises due to differential uptake of impurities at inclined risers. In this regard, the growth surface of nitrogen-doped CVD synthetic diamond shows sequences of growth steps with terrace regions separated by inclined risers. This is known as step-flow growth and it has been found that high nitrogen and/or high substrate temperature growth can lead to the formation of particularly coarse/large steps. When examining a CVD synthetic diamond sample one may observe a striated pattern, these striations corresponding to regions of high and low impurity density. These striations are particularly notable for high nitrogen/high substrate temperature growth. The spacing between the striations corresponds with the spacing between the steps on the growth surface. While not being bound by theory it is thus believed that the striations are caused by differential uptake of impurity-related defects on the risers and terraces of surface steps with defect incorporation on the risers of the steps (angled with respect to the growth surface) being greater than that on the terraces of the steps (parallel with respect to the growth surface).

In light of the above, in addition to controlling dopant concentration and layer thickness it is advantageous to reduce non-uniform uptake of impurities at risers or otherwise reduce the size of the risers. This may be achieved by one or more of: adding oxygen into the CVD synthesis atmosphere; reducing the quantity of carbon source gas in the CVD synthesis atmosphere; and/or reducing the temperature of the substrate. In addition, non-uniform uptake of impurities or dopants such as nitrogen can still occur due to temperature variations at the growth surface which affect the rate of impurity/dopant uptake. These temperature variations can be in a lateral direction relative to the growth direction at a particular point in the growth run (spatially distributed) or parallel to the growth direction due to variations in temperature over the duration of a growth run (temporally distributed). Accordingly, it is also important to provide an effective thermal management configuration for precisely controlling the temperature across the growth surface of CVD diamond material both: (i) in a lateral direction to avoid lateral non-uniformities in impurity/dopant uptake at any one point in time during a growth run; and (ii) throughout the growth run to avoid vertical non-uniformities in impurity/dopant uptake as the growth run progresses (except those intentionally introduced by a controlled layering process as described herein). A number of different features may contribute to the provision of an effective thermal management configuration including one or more of: (i) good thermal contact between the single crystal diamond substrate on which the CVD synthetic diamond material is to be grown and an underlying support substrate; (ii) an underlying support substrate which has high thermal conductivity and which can function as an effective heat sink to remove thermal energy from the single crystal CVD synthetic diamond material being grown and which is capable of maintaining uniform temperatures across the surface of the support substrate on which one or more single crystal diamond substrates are mounted; (iii) a temperature control system which can quickly and reproducibly change the temperature of the support substrate and thus quickly and reproducibly account for any variations in the temperature of the single crystal CVD synthetic diamond material being grown due to the provision of a good thermal contact between the single crystal CVD synthetic diamond material and the underlying support substrate as specified in point (i); and (iv) a temperature monitoring system which can measure the temperature of the single crystal CVD synthetic diamond material being grown (or the underlying single crystal diamond substrate or support substrate if these are all provided in good thermal contact) in a reproducible manner such that any temperature variations can be detected and the temperature control system used to counteract such variations. As such, it is advantageous to provide a synthesis configuration which meets these thermal management requirements in addition to careful control of dopant concentrations and layer thicknesses in order to produce single crystal CVD synthetic diamond material having uniform colour.

While this invention has been particularly shown and described with reference to preferred embodiments, it will be understood to those skilled in the art that various changes in form and detail may be made without departing from the scope of the invention as defined by the appendant claims.

The invention claimed is:

1. A blue coloured single crystal CVD synthetic diamond material comprising:
   a plurality of layers,
   wherein the plurality of layers includes at least two sets of layers which differ in terms of their defect composition and colour,
   wherein defect type, defect concentration, and layer thickness for each of the at least two sets of layers is such that if the coloured single crystal CVD diamond material is fabricated into a round brilliant cut diamond comprising a table and a culet, and having a table to culet depth greater than 1 mm, the round brilliant cut diamond comprises a uniform colour as viewed by naked human eye under standard ambient viewing conditions in at least a direction through the table to the culet,
   wherein the at least two sets of layers comprise a first set of layers comprising boron dopant at a concentration sufficient to produce a blue colouration and a second set of layers comprising a lower concentration of boron dopant,
   wherein the first set of layers comprises an uncompensated boron dopant concentration no less than 0.05 ppm and no more than 5.00 ppm,
   wherein the second set of layers comprises single substitutional nitrogen dopant at a concentration of no less than 0.1 ppm and no more than 5 ppm, and wherein the second set of layers has a layer thickness that is greater than the first set of layers, and a layer thickness no less than 0.1 mm;
   wherein a figure of merit (FM) for visibility of individual layers is no more than 0.15, wherein the figure of merit for visibility of individual layers is calculated as the following product:

$$FM = F_L \times S_L \times B_c \times C_d$$

wherein $F_L$ is a layer thickness (mm) for the first set of layers, $S_L$ is a layer thickness (mm) for the second set of layers, $B_c$ is a solid boron concentration (ppm) in the first set of layers, and $C_d$ is a round cut brilliant depth (mm).

2. A blue coloured single crystal CVD synthetic diamond material according to claim 1, wherein the plurality of layers comprises at least 5, 10, 20, 30, 40 or 50 layers.

3. A blue coloured single crystal CVD synthetic diamond material according to claim 1, wherein the round brilliant cut diamond comprises a uniform colour as viewed by naked human eye under standard ambient viewing conditions in a direction from the culet to the table.

4. A blue coloured single crystal CVD synthetic diamond material according to claim 1, wherein the round brilliant cut diamond comprises a uniform colour as viewed by naked human eye under standard ambient viewing conditions from a side in a direction perpendicular to the table to culet direction.

5. A blue coloured single crystal CVD synthetic diamond material according to claim 1, wherein the round brilliant cut diamond has a size no less than 0.01 ct.

6. A blue coloured single crystal CVD synthetic diamond material according to claim 1, wherein the first set of layers comprises an uncompensated boron dopant concentration no less than 0.09 ppm and no more than 4.00 ppm.

7. A blue coloured single crystal CVD synthetic diamond material according to claim 1, wherein the second set of layers comprises single substitutional nitrogen dopant at a concentration of no less than 0.5 ppm and no more than 5 ppm.

8. A blue coloured single crystal CVD synthetic diamond material according to claim 1, wherein the first set of layers has a layer thickness no more than 0.1 mm and no less than 0.001 mm.

9. A blue coloured single crystal CVD synthetic diamond material according to claim 1, wherein a figure of merit (FM) for visibility of individual layers is no more than 0.13.

10. A method of fabricating a blue coloured single crystal CVD synthetic diamond material according to claim 1, the method comprising:
varying a dopant gas concentration in a single crystal CVD synthetic diamond growth process to form a coloured single crystal CVD synthetic diamond material comprising plurality of layers which differ in terms of their defect composition and colour,
wherein the dopant gas concentration and time period of the variation in dopant gas concentration is controlled such that if the coloured single crystal CVD diamond material is fabricated into a round brilliant cut diamond comprising a table and a culet, and having a table to culet depth greater than 1 mm, the round brilliant cut diamond comprises a uniform colour as viewed by naked human eye under standard ambient viewing conditions in at least a direction through the table to the culet.

11. A method according to claim 10, wherein the plurality of layers comprises a first set of layers comprising a first dopant and a second set of layers comprising a second dopant, and wherein at a transition point between a first layer and a second layer the second dopant is initially introduced at a higher concentration and then reduced during growth of the second layer to compensate for the first dopant which continues to be incorporated into the second layer after the transition point between the first and second layers.

12. A method according to claim 10, further comprising annealing the coloured single crystal CVD synthetic diamond material.

* * * * *